United States Patent
Kim et al.

(10) Patent No.: US 11,299,639 B2
(45) Date of Patent: Apr. 12, 2022

(54) ZINC-BASED PLATED STEEL MATERIAL HAVING EXCELLENT SEALER ADHESION

(71) Applicant: POSCO, Pohang-si (KR)

(72) Inventors: Yeon-Ho Kim, Gwangyang-si (KR); Yong-Woon Kim, Gwangyang-si (KR); Yung-Keun Kim, Gwangyang-si (KR); Yon-Kyun Song, Gwangyang-si (KR)

(73) Assignee: POSCO, Pohang-si (KR)

( * ) Notice: Subject to any disclaimer, the term of this patent is extended or adjusted under 35 U.S.C. 154(b) by 183 days.

(21) Appl. No.: 16/471,889

(22) PCT Filed: Dec. 22, 2017

(86) PCT No.: PCT/KR2017/015402
§ 371 (c)(1),
(2) Date: Jun. 20, 2019

(87) PCT Pub. No.: WO2018/117759
PCT Pub. Date: Jun. 28, 2018

(65) Prior Publication Data
US 2019/0315977 A1    Oct. 17, 2019

(30) Foreign Application Priority Data
Dec. 23, 2016    (KR) .................. 10-2016-0177331

(51) Int. Cl.
| B32B 15/08 | (2006.01) |
| B32B 15/18 | (2006.01) |
| C23C 2/02 | (2006.01) |
| C23C 2/26 | (2006.01) |
| C25D 3/22 | (2006.01) |
| C25D 5/48 | (2006.01) |
| C09D 7/61 | (2018.01) |

(Continued)

(52) U.S. Cl.
CPC ................. *C09D 7/61* (2018.01); *B05D 7/14* (2013.01); *B32B 15/013* (2013.01); *B32B 15/04* (2013.01); *B32B 15/043* (2013.01); *B32B 15/08* (2013.01); *B32B 15/18* (2013.01); *B32B 15/20* (2013.01); *C08K 3/22* (2013.01); *C09D 171/02* (2013.01); *C23C 2/06* (2013.01); *C23C 2/26* (2013.01); *C23C 2/40* (2013.01); *C23C 4/11* (2016.01); *C23C 14/08* (2013.01); *C23C 14/16* (2013.01); *C23C 14/58* (2013.01); *C23C 16/40* (2013.01); *C23C 16/403* (2013.01); *C23C 16/405* (2013.01); *C23C 16/406* (2013.01); *C23C 28/00* (2013.01); *C23C 28/30* (2013.01); *C23C 28/321* (2013.01); *C23C 28/3225* (2013.01); *C23C 28/34* (2013.01); *C23C 28/345* (2013.01); *C23C 28/3455* (2013.01); *C23C 30/00* (2013.01); *C23C 30/005* (2013.01); *C25D 3/22* (2013.01); *C25D 5/48* (2013.01); *C08K 3/08* (2013.01); *C08K 3/24* (2013.01); *C22C 18/04* (2013.01); *Y10T 428/1259* (2015.01);

(Continued)

(58) Field of Classification Search
CPC .......... C09D 171/02; C09D 7/61; C08K 3/22; C08K 3/08; C08K 3/24; C23C 2/06; C23C 2/26; C23C 2/40; C23C 28/00; C23C 28/3225; C23C 28/345; C23C 28/30; C23C 28/321; C23C 28/34; C23C 28/3455; C23C 4/11; C23C 14/08; C23C 14/16; C23C 14/58; C23C 16/40; C23C 16/403; C23C 16/405; C23C 16/406; C23C 30/00; C23C 30/005; B32B 15/08; B32B 15/18; B32B 15/013; B32B 15/04; B32B 15/043; B32B 15/20; C25D 3/22; C25D 5/48; C22C 18/04; Y10T 428/12556; Y10T 428/12569; Y10T 428/1259; Y10T 428/12799; Y10T 428/12958; Y10T 428/12597; Y10T 428/12604; Y10T 428/12611; Y10T 428/12979; Y10T 428/12757; Y10T 428/12618; Y10T 428/1266; Y10T 428/12667; Y10T 428/27; Y10T 428/273; Y10T 428/12806; Y10T 428/12972; B05D 7/14

See application file for complete search history.

(56) References Cited

U.S. PATENT DOCUMENTS

| 2002/0098345 A1* | 7/2002 | Kamo ..................... C23C 22/74 428/336 |
| 2005/0139291 A1 | 6/2005 | Taira et al. |
| 2018/0363119 A1 | 12/2018 | Kim et al. |

FOREIGN PATENT DOCUMENTS

| EP | 2060660 | 5/2009 |
| JP | 05214559 | 8/1993 |

(Continued)

OTHER PUBLICATIONS

European Search Report—European Application No. 17882913.1, dated Nov. 7, 2019, citing EP 3 396 011, JP 05 214559 and EP 2 060 660.

(Continued)

*Primary Examiner* — Michael E. La Villa
(74) *Attorney, Agent, or Firm* — Cantor Colburn LLP

(57) ABSTRACT

Provided are a zinc-base plated steel material comprising a base steel and a zinc-based plated layer and a post-treatment film, which are sequentially formed on the base steel. The post-treatment film comprises an oxide or oxide salt of at least one group A element selected from B, Al, V, and Fe and an organic compound, wherein the content of oxygen atoms in the post-treatment film is 50 atom % or more, and wherein when the mole number of oxygen atoms forming a covalent bond with hydrogen in the post-treatment film is a and the mole number of oxygen atoms not forming the covalent bond with hydrogen is b, a/b is 0.3 or greater; and a composition for forming the post-treatment film.

16 Claims, No Drawings

(51) Int. Cl.
<table>
<tr><td>C09D 171/02</td><td>(2006.01)</td></tr>
<tr><td>C23C 2/06</td><td>(2006.01)</td></tr>
<tr><td>C23C 28/00</td><td>(2006.01)</td></tr>
<tr><td>C23C 4/11</td><td>(2016.01)</td></tr>
<tr><td>C23C 14/08</td><td>(2006.01)</td></tr>
<tr><td>C23C 14/16</td><td>(2006.01)</td></tr>
<tr><td>C23C 14/58</td><td>(2006.01)</td></tr>
<tr><td>C23C 16/40</td><td>(2006.01)</td></tr>
<tr><td>C08K 3/22</td><td>(2006.01)</td></tr>
<tr><td>B05D 7/14</td><td>(2006.01)</td></tr>
<tr><td>C23C 30/00</td><td>(2006.01)</td></tr>
<tr><td>C23C 2/40</td><td>(2006.01)</td></tr>
<tr><td>B32B 15/04</td><td>(2006.01)</td></tr>
<tr><td>B32B 15/20</td><td>(2006.01)</td></tr>
<tr><td>B32B 15/01</td><td>(2006.01)</td></tr>
<tr><td>C08K 3/08</td><td>(2006.01)</td></tr>
<tr><td>C08K 3/24</td><td>(2006.01)</td></tr>
<tr><td>C22C 18/04</td><td>(2006.01)</td></tr>
</table>

(52) U.S. Cl.
CPC .. *Y10T 428/1266* (2015.01); *Y10T 428/12556* (2015.01); *Y10T 428/12569* (2015.01); *Y10T 428/12597* (2015.01); *Y10T 428/12604* (2015.01); *Y10T 428/12611* (2015.01); *Y10T 428/12618* (2015.01); *Y10T 428/12667* (2015.01); *Y10T 428/12757* (2015.01); *Y10T 428/12799* (2015.01); *Y10T 428/12806* (2015.01); *Y10T 428/12958* (2015.01); *Y10T 428/12972* (2015.01); *Y10T 428/12979* (2015.01); *Y10T 428/27* (2015.01); *Y10T 428/273* (2015.01)

(56) References Cited

FOREIGN PATENT DOCUMENTS

<table>
<tr><td>JP</td><td>08296058</td><td>11/1996</td></tr>
<tr><td>JP</td><td>08296065</td><td>11/1996</td></tr>
<tr><td>JP</td><td>09268375</td><td>10/1997</td></tr>
<tr><td>JP</td><td>10018050</td><td>1/1998</td></tr>
<tr><td>JP</td><td>2000178761</td><td>6/2000</td></tr>
<tr><td>JP</td><td>2001234358</td><td>8/2001</td></tr>
<tr><td>JP</td><td>2006052462</td><td>2/2006</td></tr>
<tr><td>JP</td><td>2010047796</td><td>3/2010</td></tr>
<tr><td>JP</td><td>2014185381</td><td>10/2014</td></tr>
<tr><td>JP</td><td>5638191</td><td>12/2014</td></tr>
<tr><td>KR</td><td>20010074527</td><td>8/2001</td></tr>
<tr><td>KR</td><td>20050047106</td><td>5/2005</td></tr>
<tr><td>KR</td><td>101103669</td><td>1/2012</td></tr>
<tr><td>KR</td><td>20130026122</td><td>3/2013</td></tr>
<tr><td>KR</td><td>101322063</td><td>10/2013</td></tr>
<tr><td>KR</td><td>101696115</td><td>1/2017</td></tr>
</table>

OTHER PUBLICATIONS

Japanese Office Action—Japanese Application No. 2019-533459 dated Oct. 6, 2020, citing JP 05-214559, JP 09-268375, JP 2000-178761, JP 2010-111898, WO 2017/111455, and KR 10-1322063.
International Search Report—PCT/KR2017/015402 dated May 30, 2018.

* cited by examiner

ZINC-BASED PLATED STEEL MATERIAL HAVING EXCELLENT SEALER ADHESION

TECHNICAL FIELD

The present disclosure relates to a zinc-based plated steel material having excellent sealer adhesion and a composition for forming a post-treatment film.

BACKGROUND ART

As a zinc-based plated steel sheet used as vehicle panels has an inexpensive price, has excellent corrosion resistance, and implements an excellent surface exterior, an increased amount of zinc-based plated steel sheet has been used for internal and exterior panels of vehicles. The plated steel sheet may go through a press forming process, an assembly process such as a welding process and an adhesion process, a degreasing process, a phosphate process, and a painting process during manufacturing of a vehicle, and properties such as lubricity, weldability, adhesion properties, paintability, and the like, may be required for the zinc-based plated steel sheet.

Zinc-based plated steel sheets may have different properties depending on a composition of a plating layer formed on the steel sheet and a method of manufacturing the same, and deteriorated properties may need to be compensated. For example, in the cases of a hot-dip galvanized steel sheet (GI) and an electrical galvanized steel sheet (EG), there may be the problem in which a plating layer may be separated during a press forming process accompanying high-pressure and high-speed friction due to a ductile plating layer such that the plating layer may be melted and attached onto a bead portion of a die. Accordingly, defects such as scratches or dents may be caused on a surface of the steel sheet. In the case of a hot-dip galvannealed steel sheet (GA), there may be the problem in which a material itself may be broken as lubricity is insufficient during a press forming process due to a high surface friction coefficient or the problem of a powdering phenomenon in which a hard plating layer is separated. For these reasons, improvement of lubricity of the plating steel sheets may be required through a post-treatment, and weldability, adhesion properties, paintability, may need to be satisfied in addition to lubricity.

Also, in the case of a zinc alloy plated steel sheet in which a plating layer includes elements such as aluminum (Al), magnesium (Mg), and the like, although press formability may be excellent, there may be the problem in which adhesion properties with a sealer may degrade during a vehicle body assembly process due to a stable metal oxide present on an outermost surface.

To address such a problem, a post-treatment may be required for a surface of a zinc-based plated steel sheet used as vehicle panels, thereby improving deteriorated properties.

As a technique related to a post-treatment, reference 1 discloses a technique of forming a phosphate layer on a surface of a galvanized layer, and reference 2 discloses a technique of forming a metal oxide layer on a surface of a galvanized layer. However, in the case of the technique of forming a phosphate layer, processes such as a surface adjustment process, a phosphate process, a washing process, a drying process, and the like, may be required, a substantial facility space and solution management may be required in an actual operation, and the technique may be dependent on reaction with a plating layer. Accordingly, a solution composition may need to be changed depending on a type of a zinc-based plated steel sheet, which may be disadvantageous. Also, in the case of the technique of forming a metal oxide layer, as there may be a limitation in a metal composition of a plating layer, there may be the problem in which it may be impossible to apply the technique to all types of zinc-based plated steel sheets.

(Reference 1) Korean Laid-Open Patent Publication No. 10-2001-0074527

(Reference 2) Japanese Laid-Open Patent Publication No. 2014-185381

DISCLOSURE

Technical Problem

An aspect of the present disclosure is to provide a zinc-based plated steel material having excellent sealer adhesion and a composition for forming a post-treatment film.

Technical Solution

According to an aspect of the present disclosure, a zinc-based plated steel material is provided, the zinc-based plated steel material including a base iron, and a zinc-based plated layer and a post-treatment film sequentially formed on the base iron, the post-treatment film comprises an oxide or oxide salt of one or more of group A elements selected from a group consisting of B, Al, V, and Fe, and an organic compound, a content of oxygen atoms in the post-treatment film is 50 atom % or higher, and when a mole number of oxygen atoms forming a covalent bond with hydrogen in the post-treatment film is a, and a mole number of oxygen atoms which do not form a covalent bond with hydrogen is b, a/b is 0.3 or greater.

According to another aspect of the present disclosure, a composition for forming a post-treatment film is provided, the composition for forming a post-treatment film including an oxide or oxide salt of one or more of group A elements selected from a group consisting of B, Al, V, and Fe, and an organic compound, a content of oxygen atoms is 50 atom % or higher, and when a mole number of oxygen atoms forming a covalent bond with hydrogen is a, and a mole number of oxygen atoms which do not form a covalent bond with hydrogen is b, a/b is 0.3 or greater.

Advantageous Effects

According to an aspect of the present disclosure, a zinc-based plated steel material including a post-treatment film may have an advantage of excellent sealer adhesion.

Also, according to an aspect of the present disclosure, a composition for forming a post-treatment film may be applied to any types of plating layers.

The advantages and effect of the present disclosure are not limited to those described above, and may be more easily understood in the process of describing specific example embodiments.

BEST MODE FOR INVENTION

Generally, a zinc-based plated steel material may be used as a steel material for vehicles, and a zinc-based plated steel material may go through a press forming process, an assembly process such as a welding process and an adhesion process, a degreasing process, a phosphate process, and a painting process in order during manufacturing a vehicle. Accordingly, a zinc-based plated steel material used as a steel material for vehicles may be required to have properties such as press workability, weldability, sealer adhesion properties, and the like. If press workability is insufficient, there may be the problem in which a plating layer may be adhered onto a die during a press forming process, or a material may be broken. If weldability is insufficient, contamination may occur in a welding electrode during an assembly process such that an electrode lifespan and the number of consecutive hitting points may decrease. If sealer adhesion properties are insufficient, there may be a problem in strength of an adhesive portion.

For these reasons, generally, to compensate insufficient properties of a zinc-based plated steel material, a post-treatment film may be formed on a zinc-based plated steel material. A post-treatment film may be required to have excellent removing film properties in addition to the above-described properties. That is because, when the removing film properties is insufficient, a post-treatment film may not be sufficiently removed during a degreasing process, and accordingly, defects may occur in a phosphate process and a painting process, subsequent processes, which may consequently degrade paintability.

Considering the background, the inventors of the present disclosure have conducted researches to provide a composition for forming a post-treatment film having excellent press workability, weldability, sealer adhesion properties, and removing film properties, and a zinc-based plated steel material including the post-treatment film formed thereon, and as a result, the present disclosure is suggested.

In the description below, a zinc-based plated steel material having excellent sealer adhesion, an aspect of the present disclosure, will be described in detail.

The zinc-based plated steel material having excellent sealer adhesion properties may include a base iron, and a zinc-based plated layer and a post-treatment film sequentially formed on the base iron. In the present disclosure, a specific type and shape of a base iron may not be particularly limited, and the base iron may be a hot-rolled steel sheet, a cold-rolled steel sheet, or a steel wire rod. Also, in the present disclosure, a type of a zinc-based plated layer may not be particularly limited, and the zinc-based plated layer may be one of a hot-dip galvanized plated layer, a hot-dip galvannealed plated layer, an electrical galvanized plated layer, and a zinc deposited layer formed by a PVD. Meanwhile, in the present disclosure, types and composition ranges of alloy elements included in the zinc-based plated layer may not be particularly limited. For example, the zinc-based plated layer may include appropriate amounts of elements such as Al, Mg, and Si in addition to Zn.

The post-treatment film may include an oxide or oxide salt of one or more group A elements selected from a group consisting of B, Al, V, and Fe, and an organic compound, and if desired, the post-treatment film may include an oxide or oxide salt of one or more group B elements selected from a group consisting of Mn, Mo, and W. In the description below, each element composition forming the post-treatment film will be described in detail.

Oxide or Oxide Salt of Group A Elements

An oxide or oxide salt of group A elements may improve adhesion with a sealer coated on the post-treatment film. The group A elements may refer to one or more elements selected from a group consisting of B, Al, V, and Fe.

In the present disclosure, a content of an oxide or oxide salt of group A elements may not be particularly limited. However, according to an example embodiment, but not limited thereto, 1 mol/kg or higher of the group A elements may be included in the post-treatment film. When a content of the group A elements is less than 1 mol/kg, adhesion strength between the post-treatment film and the sealer may be insufficient, which may be a problem.

In the present disclosure, a specific type of an oxide or oxide salt of group A elements may not be particularly limited. For example, when a group A element is boron (B), an oxide or oxide salt of the group A element may be boracic acid, borax, or the like.

According to the example embodiment, an oxide or oxide salt of group A elements may have at least one or more hydroxyl groups in a solution of pH 4 to 7 range, which may be advantageous to improving sealer adhesion properties of the post-treatment film.

Oxide or Oxide Salt of Group B Elements

An oxide or oxide salt of group B elements may improve adhesion between the post-treatment film and a material. However, in the present disclosure, even though the element is not included, there may be no significant problem in securing sealer adhesion properties. Group B elements may refer to one or more elements selected from a group consisting of Mn, Mo, and W.

In the present disclosure, a content of an oxide or oxide salt of group B elements may not be particularly limited. However, according to an example embodiment, but not limited thereto, 3.5 mol/kg or less of group B elements may be included in the post-treatment film. When a content of group B elements exceeds 3.5 mol/kg, a content of group A elements may relatively decrease such that sealer adhesion properties may degrade, and adhesion with a material may increase, such that removing film properties of the post-treatment film may be deteriorated.

In the present disclosure, a specific type of an oxide or oxide salt of group B elements may not be particularly limited. For example, when a group B element is molybdenum (Mo), an oxide or oxide salt of the group B element may be ammoniummolybdate, sodium phosphomolybdic acid, sodium molybdate, and the like.

Organic Compound

The organic compound may work as a binder which may allow an oxide or oxide salt in the post-treatment film to be stably present, and may partially improve sealer adhesion properties.

A content of the organic compound may not be particularly limited in the present disclosure. However, according to an example embodiment, but not limited thereto, the organic compound may be included in an amount of 5 parts by weight to 30 parts by weight based on 100 parts by weight of the post-treatment film. When the content is less than 5 parts by weight, film stability or seal adhesion properties may be deteriorated. When the content exceeds 30 parts by weight, the content may be advantageous in terms of seal adhesion properties, but the organic compound itself may work as an adhesive such that the zinc-based plated steel materials in a coil state may be adhered to each other, or worse, the removing of the post-treatment film in a degreasing process during a vehicle assembly process may be insufficient, which may cause defects during a phosphate process and a painting process, subsequent processes.

According to the example embodiment, the organic compound may have at least one or more hydroxyl groups or carboxyl groups. More specifically, the organic compound may be one or more compounds selected from a group consisting of polyvinyl acetate (PVAc), polyvinyl alcohol (PVA), polyacrylic acid (PAA), polyvinyl butyral (PVB), and polyethylene glycol (PEG), which may be advantageous to improving film stability and sealer adhesion properties.

In the description below, other characteristics of the post-treatment film will be described in detail.

In the zinc-based plated steel material having excellent sealer adhesion properties, an aspect of the present disclosure, a content of oxygen atoms in the post-treatment film may be 50 atom % or higher. When a content of oxygen atoms is less than 50 atom %, an amount of hydroxyl group which may contribute to improving adhesion with a sealer and may work as a bond site may be insufficient, and adhesion strength between the zinc-based plated steel material and a sealer may be deteriorated. A content of oxygen atoms in the post-treatment film may refer to a value observed or calculated only in consideration of elements and oxygen in the post-treatment film, excluding elements of the plating layer and hydrogen, and may be measured using an XPS (X-ray photoelectron spectroscopy) analysis method after removing contamination or rust preventive oil by acetone-degreasing the zinc-based plated steel material including the post-treatment film formed thereon. The reason why the plating layer elements are excluded when calculating an oxygen content is that the composition for forming the post-treatment film of the present disclosure may rarely react with the plating layer, and if the composition for forming the post-treatment film reacts with the plating layer and the elements of the plating layer affect the composition of the post-treatment film, it may be required to calculate the oxygen content in consideration of contents of elements of the plating layer. Meanwhile, a more preferable content of oxygen atoms in the composition for forming the film may be 55 atoms % or higher, and an even more preferable content may be 60 atoms % or higher.

Also, the zinc-based plated steel material having excellent sealer adhesion properties, an aspect of the present disclosure, may be characterized in that, when a mole number of oxygen atoms forming a covalent bond with hydrogen in the post-treatment film is a, and a mole number of oxygen atoms which do not form a covalent bond with hydrogen is b, a/b may be 0.3 or greater. When a/b is less than 0.3, an amount of hydroxyl group which may contribute to improving adhesion with a sealer and may work as a bond site may be insufficient such that adhesion strength between the zinc-based plated steel material and a sealer may be deteriorated. The greater the value of a/b, it may be more advantageous to improving sealer adhesion properties, and thus, in the present disclosure, an upper limit thereof may not be particularly limited. However, when the value is excessively high, the value may be disadvantageous in terms of adhesion with a material and film stability, and thus, considering this, an upper limit thereof may be limited to 10. a/b may be obtained through curve filling of a binding energy peak of oxygen measured using an XPS (X-ray photoelectron spectroscopy) analysis method after removing contamination or rust preventive oil by acetone-degreasing the zinc-based plated steel material including the post-treatment film formed thereon. Amore preferable range of a/b may be 1.0 or greater to 9.0 or less, and an even more preferable range of a/b may be 2.0 or greater to 8.0 or less.

According to the example embodiment, in the case in which the post-treatment film of the zinc-based plated steel material having excellent sealer adhesion properties of the present disclosure includes an oxide or oxide salt of group B elements, when a mole number of the group A elements having at least one or more hydroxyl groups in a solution of pH 4 to 7 range is c, and a mole number of the group B elements is d, c/d may be 0.5 or greater, which may be advantageous to improving sealer adhesion properties of the post-treatment film. The greater the value of c/d, it may be more advantageous to improving sealer adhesion properties, and thus, in the present disclosure, an upper limit thereof may not be particularly limited. However, when the value is excessively high, the value may be disadvantageous in terms of adhesion with a material and film stability, and thus, considering this, an upper limit thereof may be limited to 100. A more preferable range of c/d may be 2.0 or greater to 50 or less, and an even more preferable range may be 5.0 or greater to 30 or less.

A specific method of forming the post-treatment film may not be particularly limited. However, according to an example embodiment, but not limited thereto, the post-treatment film may be formed by a dry coating method such as a PVD (physical vapor deposition) and a CVD (chemical vapor deposition), a powder spraying coating method such as a thermal spray coating, a solution coating method such as a roll coating process, and the like. When the post-treatment film is formed by a solution coating method, a process may be simplified, and costs of operating the process may be lowered, which may be advantageous.

However, when the post-treatment film is formed by a solution coating method, it may be required to control a drying temperature to be lower than 150° C. during drying after coating. When the drying temperature is 150° C. or higher, a/b of the post-treatment film may decrease as compared to a/b of the composition for forming a post-treatment film such that it may be difficult to achieve the purpose of improving sealer adhesion properties.

In the present disclosure, an amount of attached film of the post-treatment film may not be particularly limited. However, according to an example embodiment, but not limited thereto, an amount of attached film of the post-treatment film may be 100 mg/m$^2$ to 1000 mg/m$^2$. When the amount of attached film is less than 100 mg/m$^2$, due to roughness of a material itself, the post-treatment film may not be uniformly formed. When the amount of attached film exceeds 1000 mg/m$^2$, manufacturing costs may increase, and a drying process may be insufficiently performed.

In the description below, a composition for forming a post-treatment film having excellent sealer adhesion, another aspect of the present disclosure, will be described in detail.

The composition for forming a post-treatment film may include an oxide or oxide salt of one or more group A elements selected from a group consisting of B, Al, V, and Fe, and an organic compound. As described above, if desired, the composition for forming a post-treatment film may include an oxide or oxide salt of one or more group B elements selected from a group consisting of Mn, Mo, and W. The reason why the post-treatment film may include the above-mentioned elements is as described in the aforementioned example embodiment. Meanwhile, in the present disclosure, other effective elements besides the above-described elements may not be excluded. For example, a leveling agent, and the like, may further be included.

The composition for forming a post-treatment film may be provided as a solution form in which the elements described below are dissolved into a solvent such as water, or may be provided as a power form in which the elements described below are mixed. When the composition for forming the post-treatment film is provided as a solution form, a content of each element described below, a content of oxygen atoms, a ratio of a mole number of oxygen atoms, and the like, may be values measured with reference to a non-volatile solid excluding a solvent such as water.

In the composition for forming the post-treatment film, a content of oxygen atoms may be 50 atom % or higher. The reason why a content of oxygen atoms in the composition for forming the post-treatment film is controlled as above is as described in the aforementioned example embodiment. A content of oxygen atoms in the composition for forming the post-treatment film may be calculated from a molecular structure of specific elements constituting the composition for forming the post-treatment film.

Also, in the composition for forming the post-treatment film, when a mole number of oxygen atoms forming a covalent bond with hydrogen is a, and a mole number of oxygen atoms which do not form a covalent bond with hydrogen is b, a/b is O. 3 or greater. The reason why a/b is controlled as above is as described in the aforementioned example embodiment. a/b may be calculated from a molecular structure of specific elements constituting the composition for forming the post-treatment film.

In the present disclosure, pH of the composition for forming the post-treatment film may not be particularly limited, but to prevent dissolution of the plating layer and to form a stable film, a preferable pH may be 3.0 to 7.0.

MODE FOR INVENTION

In the description below, an embodiment of the present disclosure will be described in detail. The below embodiment is provided for understanding of the present disclosure, and will not limit the present disclosure. That is because the scope of right of the present disclosure is determined on the basis of the matters claimed in the claims and matters reasonably inferred therefrom.

Embodiment

A zinc-based plated steel sheet having a thickness of 0.8 mm, an elongation rate of 36 to 37%, an amount of plating of 35 g/m$^2$, and having a plating layer including 1.4% of Al, 1.4% of Mg, and 97.2% of Zn was prepared, the zinc-based plated steel sheet was coated with a post-treatment coating solution by a bar-coating method, and a post-treatment film was formed with an amount of coating of 300 mg/m$^2$ under a condition of PMT of 100° C. In each sample, a post-treatment film was manufactured while differentiating only contents of elements included in a composition for forming the post-treatment film, and a content of each element included in the manufactured post-treatment film was listed in Table 1 below. A conventional example in Table 1 below refers to an example in which the post-treatment film was not formed.

A content of oxygen in the post-treatment film and a/b were measured, and the results were listed in Table 1 as well. A content of oxygen in the post-treatment film is an average value of each unit depth of a nanometer scale, obtained by measuring the zinc-based plated steel material including the post-treatment film formed thereon using an XPS (X-ray Photoelectron Spectroscopy) analysis method, and a/b is an average value of each unit depth obtained through curve fitting of an oxygen (O) binding energy peak measured using an XPS analysis method.

Workability, sealer adhesion properties, and removing film properties of each sample were tested, and the results were listed in Table 1 as well.

<Workability Test>

To test workability, a cup drawing test was performed, and in the cup drawing test, a testing device including a die and a punch was used. The test was performed while increasing BHF(Blank Holding Force), and a BHF value right before breakage of a material occurred was determined as a maximum BHF value, and was listed in Table 1. The higher the maximum BHF value, the more excellent the workability may be, and specific conditions of the cup drawing test conducted in the present disclosure were as below.

Specific Conditions of Cup Drawing Test
Punch diameter: 50 mm
Punch edge radius: 6 mm
Die diameter: 52.25 mm
Punch moving speed: 230 mm/min
The post-treatment film was in contact with the die, and the test was performed after coating a surface with washing oil.

<Sealer Adhesion Properties Test>

In the adhesion test, two samples of a size of 25 mm×100 mm were manufactured, washing oil was coated, the samples were stood up vertically and maintained for one day, a mastic sealer adhesive was coated at a position of 10 mm from edges of the sample in a size of 25 mm (width)×25 mm (length)×3 mm (height), the other sample was piled on the sample and cured at 170° C. for 20 minutes, adhesion shear strength of each of the upper/lower samples was measured, and the results were listed in Table 1. The shear strength was measure at a speed of 50 mm/min, and the measured maximum force was divided by an adhesion area of 6.25 cm$^2$, and the result was listed. As for whether sealer adhesion properties was good or not, when a value is greater than 1.0 kgf/cm$^2$, a reference value, sealer adhesion properties was determined as good.

<Removing Film Properties Test>

In the removing film properties test, a material was stirred and submerged using a degreasing solution used in a vehicle manufacturing process at 50 to 55° C. for two minutes and was washed, an amount of coated film remaining on a surface of the material was measured, and a removing film rate based on an amount of coated film before degreasing was calculated by percentage and listed in Table 1. As for a residual amount of a coated film, a certain area of the coated layer was dissolved using an acid solution, a content of molybdenum of the dissolving solution was quantitative-analyzed using an ICP (inductively coupled plasma), and an amount of residue in each area was calculated.

TABLE 1

| | Post-Treatment Film Composition | | | | | | | Properties Test Result | | |
|---|---|---|---|---|---|---|---|---|---|---|
| | Mo Acid | | | | Content of | | | | | |
| Classification | Salt Compound (wt %) | Boron Compound (wt %) | PEG (wt %) | Other Additives (wt %) | Oxygen in Film (Atom %) | a/b | c/d | Maximum BHF (ton) | Adhesion Strength (kgf/cm$^2$) | Removing Film Rate (%) |
| Conventional Example | — | — | — | — | — | — | — | 6 | 0.4 | — |
| Comparative Example 1 | 76.90 | 0.00 | 18.08 | 5.02 | 48.23 | 0.01 | 0.00 | 12 | 0.8 | 93 |
| Comparative Example 2 | 70.41 | 6.12 | 18.37 | 5.10 | 51.84 | 0.17 | 0.28 | 11 | 0.9 | 96 |
| Inventive Example 1 | 66.67 | 10.78 | 17.65 | 4.90 | 53.51 | 0.31 | 0.51 | 10 | 1.3 | 95 |
| Inventive Example 2 | 49.77 | 20.93 | 22.93 | 6.37 | 54.54 | 0.68 | 1.33 | 11 | 2.1 | 93 |
| Inventive Example 3 | 41.32 | 32.00 | 20.88 | 5.80 | 57.91 | 1.21 | 2.45 | 9 | 4.2 | 93 |

TABLE 1-continued

| | Post-Treatment Film Composition | | | | | | | Properties Test Result | | |
| --- | --- | --- | --- | --- | --- | --- | --- | --- | --- | --- |
| | Mo Acid | | | | Content of | | | | | |
| Classification | Salt Compound (wt %) | Boron Compound (wt %) | PEG (wt %) | Other Additives (wt %) | Oxygen in Film (Atom %) | a/b | c/d | Maximum BHF (ton) | Adhesion Strength (kgf/cm²) | Removing Film Rate (%) |
| Inventive Example 4 | 39.77 | 34.09 | 20.45 | 5.68 | 58.52 | 1.33 | 2.72 | 13 | 4.5 | 94 |
| Inventive Example 5 | 28.09 | 46.48 | 19.90 | 5.53 | 61.26 | 2.25 | 5.24 | 14 | 5.0 | 93 |
| Inventive Example 6 | 20.10 | 57.01 | 17.91 | 4.98 | 63.79 | 3.46 | 8.99 | 10 | 5.0 | 95 |
| Inventive Example 7 | 16.13 | 63.04 | 16.30 | 4.53 | 65.29 | 4.47 | 12.38 | 13 | 5.1 | 95 |
| Inventive Example 8 | 13.45 | 65.36 | 16.58 | 4.61 | 65.57 | 4.98 | 15.40 | 10 | 5.2 | 96 |
| Inventive Example 9 | 7.90 | 72.90 | 15.03 | 4.18 | 67.16 | 7.21 | 29.24 | 12 | 5.1 | 97 |
| Inventive Example 10 | 2.63 | 77.19 | 15.79 | 4.39 | 67.54 | 9.37 | 92.94 | 11 | 4.8 | 97 |
| Inventive Example 11 | 0.89 | 78.57 | 16.07 | 4.46 | 67.65 | 10.28 | 278.83 | 13 | 4.8 | 99 |
| Inventive Example 12 | 0.00 | 80.23 | 15.48 | 4.30 | 68.05 | 11.46 | — | 11 | 4.3 | 98 |

Referring to Table 1, as for conventional example and comparative examples 1 and 2 in which a content of oxygen (O) was lower than 50 atom % or a/b was less than 0.3, adhesion strength was less than 1.0 kgf/cm² such that a sealer adhesion properties reference was not satisfied.

Differently from the comparative examples, as for inventive examples 1 to 12 in which a content of oxygen (O) was 50 atom % or greater and a/b was 0.3 or greater, adhesion strength sufficiently satisfied 1.0 kgf/cm² or more, an adhesion strength reference. Particularly, the higher the content of oxygen (O) in the film and a/b, the higher the adhesion strength was. However, as for inventive examples 11 and 12, a film composition during drying after coating was not uniform such that stains were created.

Although an adhesion strength reference was 1.0 kgf/cm², considering a cohesion breakage rate of a broken surface of an adhesion portion after testing shear strength, and to secure more solid adhesion strength, a preferable content of oxygen (O) included in the post-treatment film may be 55 atom % or higher, and a/b may be 1.0 or greater more preferably.

A maximum BHF value and removing film properties were excellent in overall post-treatment film conditions regardless of a content of oxygen in the film or a/b. Particularly, maximum BHF values of comparative examples 1 and 2 and inventive examples 1 to 12 in which the post-treatment film was formed were higher than that of the conventional example, a non-treatment material, which indicates that workability may significantly improve when the post-treatment film is formed.

Meanwhile, in the present disclosure, a/b in the film was controlled using a large amount of oxide or oxide salt and a small amount of an organic compound, but the present disclosure is not limited thereto. In addition to the method described above, a/b in the film may also be controlled using a ratio between oxygen and hydroxyl group present in a molecular structure of the organic compound formed in 30 weight % or lower in the film.

While the exemplary embodiments have been shown and described above, it will be apparent to those skilled in the art that modifications and variations could be made without departing from the scope of the present invention as defined by the appended claims.

The invention claimed is:

1. A zinc-based plated steel material, comprising:
   a base steel;
   a zinc-based plated layer formed on the base steel; and
   a post-treatment film formed on the zinc-based plated layer,
   wherein the post-treatment film comprises an oxide or an oxide salt of one or more of group A elements selected from the group consisting of B, Al, V, and Fe, and an organic compound,
   wherein a content of oxygen atoms in the post-treatment film is 50 atom % or higher, and
   wherein, when a mole number of oxygen atoms forming a covalent bond with hydrogen in the post-treatment film is a, and a mole number of oxygen atoms which do not form a covalent bond with hydrogen in the post-treatment film is b, a/b is 0.3 or greater.

2. The zinc-based plated steel material of claim 1, wherein the post-treatment film further comprises an oxide or an oxide salt of one or more group B elements selected from the group consisting of Mn, Mo, and W.

3. The zinc-based plated steel material of claim 2, wherein the oxide or the oxide salt of the group A elements has at least one or more hydroxyl groups in a solution of pH 4 to 7 range, and when a mole number of the group A elements is c, and a mole number of the group B elements is d, c/d is 0.5 or greater.

4. The zinc-based plated steel material of claim 3, wherein the c/d is 100 or less.

5. The zinc-based plated steel material of claim 3, wherein the c/d is 2.0 or greater to 50 or less.

6. The zinc-based plated steel material of claim 3, wherein the c/d is 5.0 or greater to 30 or less.

7. The zinc-based plated steel material of claim 1, wherein the content of the oxygen atoms in the post-treatment film is 55 atom % or higher.

8. The zinc-based plated steel material of claim 1, wherein the content of the oxygen atoms in the post-treatment film is 60 atom % or higher.

9. The zinc-based plated steel material of claim 1, wherein the a/b is 10.0 or less.

10. The zinc-based plated steel material of claim 1, wherein the a/b is 1.0 or greater to 9.0 or less.

11. The zinc-based plated steel material of claim 1, wherein the a/b is 2.0 or greater to 8.0 or less.

12. The zinc-based plated steel material of claim 1, wherein the oxide or the oxide salt of the group A elements has at least one or more hydroxyl groups in a solution of pH 4 to 7 range.

13. The zinc-based plated steel material of claim 1, wherein the organic compound is included in an amount of 5 parts by weight to 30 parts by weight based on 100 parts by weight of the post-treatment film.

14. The zinc-based plated steel material of claim 1, wherein the organic compound has at least one or more hydroxyl groups or carboxyl groups.

15. The zinc-based plated steel material of claim 1, wherein the organic compound is one or more compounds selected from the group consisting of polyvinyl acetate (PVAc), polyvinyl alcohol (PVA), polyacrylic acid (PAA), polyvinyl butyral (PVB), and polyethylene glycol (PEG).

16. The zinc-based plated steel material of claim 1, wherein an amount of coated film of the post-treatment film is 100 mg/m$^2$ to 1000 mg/m$^2$.

* * * * *